(12) United States Patent
Joo et al.

(10) Patent No.: US 10,615,561 B2
(45) Date of Patent: Apr. 7, 2020

(54) MULTI-WAVELENGTH LASER APPARATUS

(71) Applicants: SAMSUNG ELECTRONICS CO., LTD., Suwon-si (KR); The Board of Trustees of the Leland Stanford Junior University, Stanford, CA (US)

(72) Inventors: Wonjae Joo, Seongnam-si (KR); Younggeun Roh, Seoul (KR); Majid Esfandyarpour, Stanford, CA (US); Mark L. Brongersma, Stanford, CA (US); Yeonsang Park, Seoul (KR)

(73) Assignees: SAMSUNG ELECTRONICS CO., LTD., Suwon-si (KR); The Board of Trustees of the Leland Stanford Junior University, Stanford, CA (US)

( * ) Notice: Subject to any disclaimer, the term of this patent is extended or adjusted under 35 U.S.C. 154(b) by 0 days.

(21) Appl. No.: 15/965,538

(22) Filed: Apr. 27, 2018

(65) Prior Publication Data

US 2018/0316155 A1    Nov. 1, 2018

Related U.S. Application Data

(60) Provisional application No. 62/491,516, filed on Apr. 28, 2017.

(30) Foreign Application Priority Data

Jul. 24, 2017   (KR) .................. 10-2017-0093687
Apr. 23, 2018   (KR) .................. 10-2018-0046989

(51) Int. Cl.
*H01S 3/1055*  (2006.01)
*H01S 3/16*    (2006.01)
(Continued)

(52) U.S. Cl.
CPC ........... *H01S 3/1055* (2013.01); *H01S 3/169* (2013.01); *H01S 5/0071* (2013.01);
(Continued)

(58) Field of Classification Search
CPC ....... H01S 3/1055; H01S 5/125; H01S 3/169; H01S 5/06236; H01S 5/0071
See application file for complete search history.

(56) References Cited

U.S. PATENT DOCUMENTS 6,487,227 B1 * 11/2002 Kuramachi ............. H01S 5/028
                                                        372/49.01
7,262,918 B1    8/2007 Yoo et al.
(Continued)

OTHER PUBLICATIONS

Sabbir Liakat et al., "Noninvasive in vivo glucose sensing on human subjects using mid-infrared light", Biomedical Optics Express, vol. 5, No. 7, OSA, Jun. 23, 2014, pp. 2397-2404.
(Continued)

*Primary Examiner* — Yuanda Zhang
(74) *Attorney, Agent, or Firm* — Sughrue Mion, PLLC

(57) ABSTRACT

A multi-wavelength laser apparatus is provided. The multi-wavelength laser apparatus may include a meta-mirror layer having a surface in which a plurality of patterns are formed, a laser emitter disposed on the meta-mirror layer, and an upper-mirror layer disposed on the laser emitter. The multi-wavelength laser apparatus may further include a conductive graphene layer between the meta-mirror layer and the laser emitter.

13 Claims, 6 Drawing Sheets

(51) Int. Cl.
*H01S 5/062* (2006.01)
*H01S 5/00* (2006.01)
*H01S 5/125* (2006.01)
*H01S 5/10* (2006.01)
*H01S 5/183* (2006.01)
*H01S 5/042* (2006.01)

(52) U.S. Cl.
CPC ........ H01S 5/06236 (2013.01); H01S 5/1096 (2013.01); H01S 5/125 (2013.01); H01S 5/18361 (2013.01); *H01S 5/0425* (2013.01); *H01S 5/1039* (2013.01); *H01S 5/18341* (2013.01); *H01S 5/18355* (2013.01); *H01S 5/18358* (2013.01); *H01S 5/18375* (2013.01)

(56) References Cited

U.S. PATENT DOCUMENTS

| | | |
|---|---|---|
| 8,831,058 B2 | 9/2014 | Morel et al. |
| 2009/0110021 A1* | 4/2009 | Conway .................. H01S 5/18 372/102 |
| 2010/0243986 A1* | 9/2010 | Ma ........................ B82Y 20/00 257/13 |
| 2010/0259826 A1* | 10/2010 | Ji .......................... B82Y 20/00 359/599 |
| 2012/0128019 A1* | 5/2012 | Chang-Hasnain .......................... H01S 5/18386 372/45.01 |
| 2015/0036350 A1 | 2/2015 | Palikaras et al. |
| 2015/0280401 A1 | 10/2015 | Lee et al. |
| 2015/0288146 A1* | 10/2015 | Chang-Hasnain ...... H01S 5/021 372/50.11 |
| 2016/0072004 A1* | 3/2016 | Song ..................... H01L 33/40 257/13 |
| 2016/0336718 A1 | 11/2016 | Takabayashi et al. |
| 2016/0363568 A1 | 12/2016 | Killeen et al. |

OTHER PUBLICATIONS

Likai Li et al., "Black Phosphorus Field-effect Transistors", Nature Nanotechnology, vol. 9, Jul. 2014, 23 pages.
Pierre Viktorovitch et al., "Silicon-compatible surface-emitting lasers: a wealth of new functionality", SPIE Newsroom, May 22, 2014, 3 pages.

* cited by examiner

MULTI-WAVELENGTH LASER APPARATUS

CROSS-REFERENCE TO RELATED APPLICATIONS

This application claims priority from U.S. Patent Provisional Application No. 62/491,516, filed on Apr. 28, 2017 in the United States Patent and Trademark Office, Korean Patent Application No. 10-2017-0093687, filed on Jul. 24, 2017 in the Korean Intellectual Property Office, and Korean Patent Application No. 10-2018-0046989, filed on Apr. 23, 2018 in the Korean Intellectual Property Office, the disclosures of which are incorporated herein in their entireties by reference.

BACKGROUND

1. Field

Apparatuses and methods consistent with example embodiments relate to a laser apparatus having two separate resonance modes with different wavelengths.

2. Description of the Related Art

There is a growing interest in techniques for measuring a distance or direction to an object, identifying an object or terrain, or detecting speed, temperature, and material distribution by using light. In this regard, studies have been made on a light source emitting laser light and a method of steering the direction of light generated from the light source.

A light source may generate laser light and may generate a single mode laser light or a multi-mode laser light. In a laser system, the length of a cavity, etc., may be selected to generate a single mode laser light or a multi-mode laser light.

SUMMARY

One or more example embodiments may provide laser apparatuses having two separate resonance modes with different wavelengths from each other and vertical polarization.

Additional aspects will be set forth in part in the description which follows and, in part, will be apparent from the description, or may be learned by practice of the example embodiments.

According to an aspect of an example embodiment, a multi-wavelength laser apparatus may include: a meta-mirror layer having a surface in which a plurality of patterns are formed; a laser emitter disposed on the meta-mirror layer; and an upper-mirror layer disposed on the laser emitter.

The plurality of patterns formed in the surface of the metal-mirror layer may include protrusions protruding toward the laser emitter and a groove region interposed between the protrusions.

The groove region may be an empty space.

The groove region may be filled with transparent material.

Each of the protrusions may have a rectangular cross-section.

A formation period of the patterns may be several hundred nanometers or less.

The meta-mirror layer may include Ag, Au, Al, Cu, Pt, Mn, Zr, Zn, or an alloy.

The laser emitter may be configured to generate at least one of visible light, near-infrared light, mid-infrared light, and far-infrared light.

The laser emitter may include at least one of a Group III-V semiconductor material layer, a mixture layer including quantum dots of a Group III-V or II-VI material, and an organic dye mixture layer.

The upper-mirror layer may include at least one of a metal material, an alloy, and a distributed Bragg reflector (DBR) structure.

The multi-wavelength laser apparatus may further include a conductive graphene layer interposed between the meta-mirror layer and the laser emitter.

The transparent material may be transparent conductive oxide, transparent inorganic dielectric or transparent organic dielectric.

The transparent material may be a flattening layer and extended on the protrusions.

BRIEF DESCRIPTION OF THE DRAWINGS

These and/or other aspects will become apparent and more readily appreciated from the following description of example embodiments, taken in conjunction with the accompanying drawings in which.

DETAILED DESCRIPTION

Figure 1:
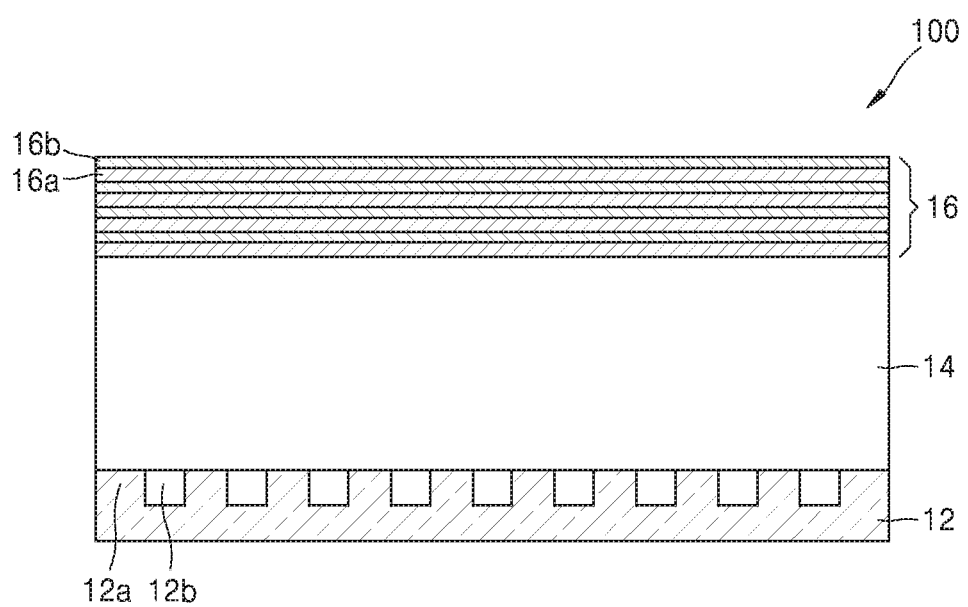
FIG. 1 is a cross-sectional view schematically illustrating a laser apparatus having two separate resonance modes with different wavelengths from each other, according to an example embodiment.

Reference will now be made in detail to example embodiments, which are illustrated in the accompanying drawings, wherein like reference numerals refer to like elements throughout and sizes of elements in the drawings may be exaggerated for convenience of explanation. In this regard, the present example embodiments may have different forms and should not be construed as being limited to the descriptions set forth herein. Accordingly, the example embodiments are merely described below, by referring to the figures, to explain aspects.

It will be understood that when a layer, region, or element is referred to as being "formed on," another layer, region, or element, it can be directly or indirectly formed on the other layer, region, or element. That is, for example, intervening layers, regions, or elements may be present. Expressions such as "at least one of," when preceding a list of elements, modify the entire list of elements and do not modify the individual elements of the list.

FIG. 1 is a view schematically illustrating a laser apparatus 100 having two separate resonance modes with different wavelengths from each other, according to an example embodiment.

Referring to FIG. 1, the laser apparatus 100 according to the present example embodiment may include a meta-mirror layer 12, a laser emitter 14 formed on the meta-mirror layer 12, and an upper-mirror layer 16 formed on the laser emitter 14.

The meta-mirror layer 12 may include a material capable of reflecting light emitted from the laser emitter 14. For example, the meta-mirror layer 12 may include a metal, such as silver (Ag), gold (Au), aluminum (Al), copper (Cu), platinum (Pt), manganese (Mn), or zirconium (Zr), or an alloy thereof. The meta-mirror layer 12 may have a metasurface shape including a plurality of patterns 12a and 12b formed in the surface thereof. The metasurface shape may mean a case where a surface includes patterns in which a distance between the patterns (i.e., the patterns 12a and 12b) is less than half the wavelength of an incident light. The plurality of patterns 12a and 12b formed in the surface of the meta-mirror layer 12 may have a shape protruding toward the laser emitter 14, for example, upward. The patterns 12a and 12b may include protrusions 12a each having a rectangular shape (e.g., a rectangular cross-section). The protrusions 12a of the meta-mirror layer 12 may be formed vertically in the direction of the laser emitter 14.

Regions between the protrusions 12a of the meta-mirror layer 12 may be grooves 12b. The grooves 12b may be empty spaces. The height of the protrusions 12a of the meta-mirror layer 12 may correspond to the depth of the grooves 12b, and the distance between the protrusions 12a of the meta-mirror layer 12 may correspond to the width of the grooves 12b. The distance between the centers of the protrusions 12a of the meta-mirror layer 12 may be a period (e.g., a formation period or a regular interval) of the patterns 12a and 12b. In the present example embodiment, the period of the patterns 12a and 12b may be several hundred nanometers (nm) or less, for example, 200 nm or less, which corresponds to a sub-wavelength range.

For example, the widths of the protrusion 12a and the groove 12b may be 1/10 to 1/5 of the wavelength of the incident light. When the incident light is in a visible light region, the widths of the protrusion 12a and the groove 12b may be about 50 nm and the period of the patterns 12a and 12b may be about 100 nm.

The height of the protrusion 12a and the depth of the groove 12b may be from about 50 nm to about 80 nm.

The laser emitter 14 is a region capable of emitting light having a predetermined wavelength and may be referred to as gain media. The laser emitter 14 may emit visible, near-infrared, mid-infrared, or far-infrared light.

The laser emitter 14 may be configured to have a structure capable of emitting laser light. For example, the laser emitter 14 may include a Group III-V semiconductor material layer such as GaAs, GaN, or InGaN or a mixture layer including quantum dots of a Group III-V or II-VI material. Alternatively, the laser emitter 14 may include an organic dye mixture layer. When the laser emitter 14 includes a Group III-V semiconductor material layer, the laser emitter 14 may have a multi-layered structure including an n-type GaAs, GaN or InGaN layer formed on a p-type GaAs, GaN or InGaN layer.

The upper-mirror layer 16 may include a metal material such as sliver (Ag), gold (Au), aluminum (Al), copper (Cu), platinum (Pt), manganese (Mn), zirconium (Zr), zinc (Zn), or an alloy thereof. The upper-mirror layer 16 may include a reflective structure. The reflective structure may include a distributed Bragg reflector (DBR) structure. The DBR structure may be a multi-layered structure in which dielectric material layers different from each other are alternately formed. For example, the DBR structure may be a structure in which a first dielectric material layer 16a and a second dielectric material layer 16b are alternately formed, or may be a structure in which several to several tens of unit structures are stacked. Each of the unit structures is a structure in which the first dielectric material layer 16a and the second dielectric material layer 16b, each having a thickness of several tens to several hundreds of nm, are stacked. One of the first dielectric material layer 16a and the second dielectric material layer 16b may be an $SiO_2$ layer and the other a $TiO_2$ layer.

Figure 2:
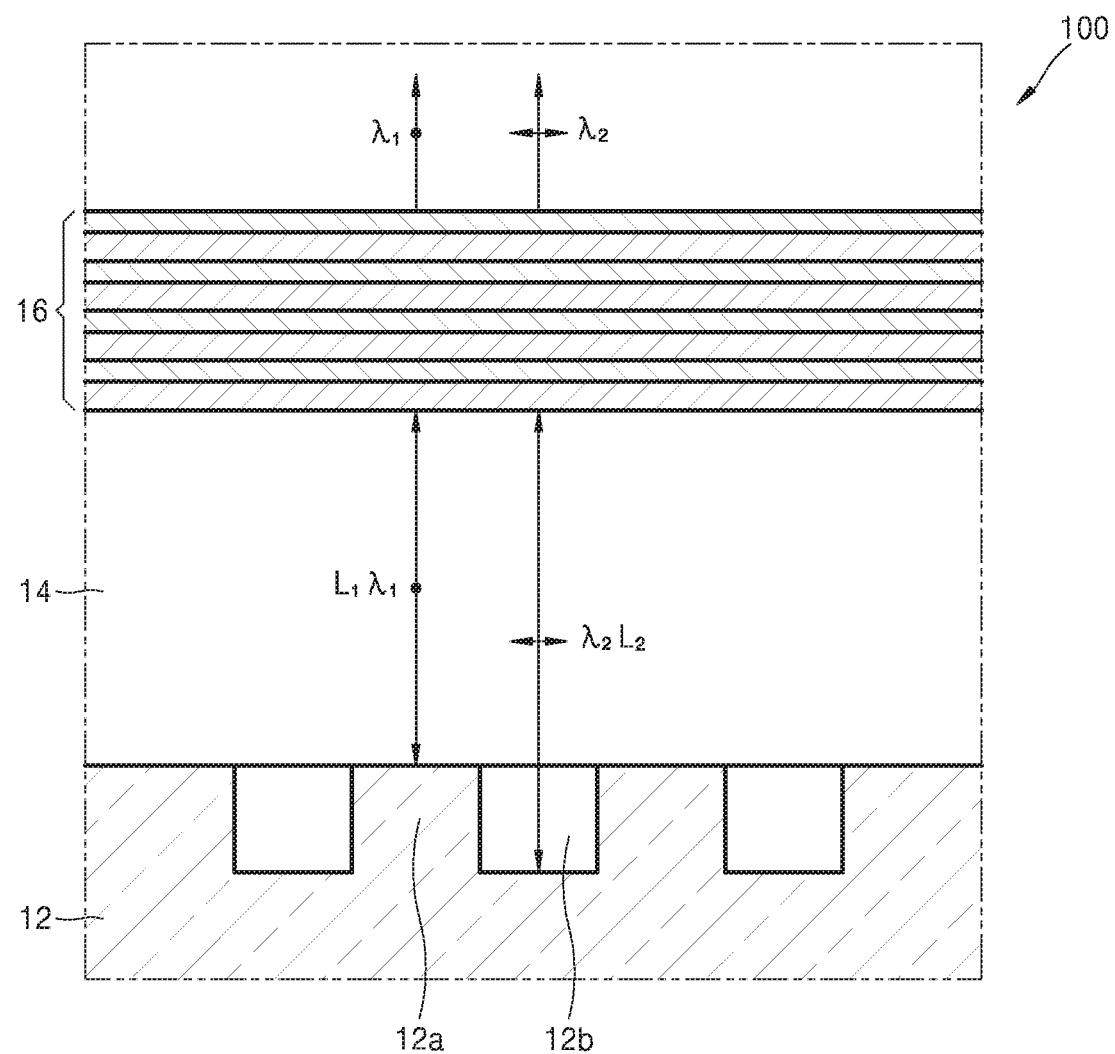
FIG. 2 is a cross-sectional view schematically illustrating two separate resonance modes of a laser apparatus according to an example embodiment.

FIG. 2 is a view schematically illustrating two separate resonance modes of the laser apparatus 100, according to an example embodiment.

Referring to FIGS. 1 and 2, light generated by the laser emitter 14 may resonate by using a cavity between the meta-mirror layer 12 and the upper-mirror layer 16 as a resonant cavity. The laser apparatus 100 according to the present example embodiment may have at least two resonance modes depending on the position of the meta-mirror layer 12. When resonance is created between the protrusions 12a of the meta-mirror layer 12 and the upper-mirror layer 16, this resonance may be referred to as a first resonance mode. Also, when resonance is created between the grooves 12b of the meta-mirror layer 12 and the upper-mirror layer 16, this resonance may be referred to as a second resonance mode. Laser apparatus 100 according to the present example embodiment may generate lights having polarization states perpendicular to each other and wavelengths different from each other through the first resonance mode and the second resonance mode. In other words, when the light generated by the laser emitter 14 is subjected to the first resonance mode, the light may become light having vertical polarization (or horizontal polarization) and a first wavelength.

When the light generated by the laser emitter 14 is subjected to the second resonance mode, the light may become light having horizontal polarization (or vertical polarization) and a second wavelength. In other words, the lights generated by the laser emitter 14 subjected to the first resonance mode and the second resonance mode may have polarization directions that are perpendicular to each other. The first wavelength and the second wavelength may be different in wavelength. The first wavelength and the second wavelength may be determined by the shapes of the patterns 12a and 12b of the meta-mirror layer 12, that is, the shapes of the protrusion 12a and the groove 12b.

Multi-wavelength laser light generated through the first resonance mode and the second resonance mode may be split and may provide vertical polarization with high accuracy in an optical sensor through an element such as a polarized beam splitter (PBS), a prism, or a polarizing plate.

Figure 3:
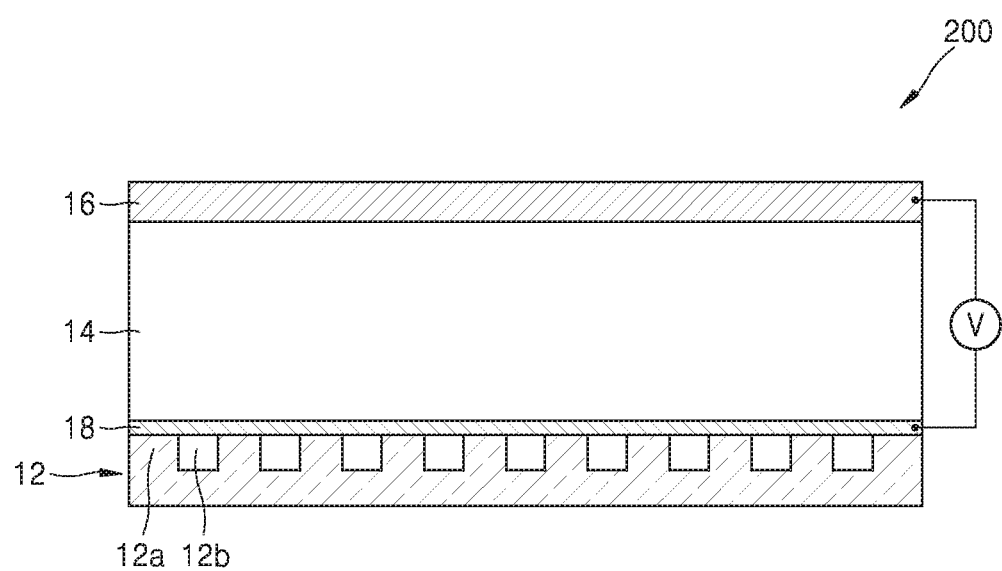
FIG. 3 is a cross-sectional view illustrating a laser apparatus that further includes a conductive graphene layer formed between a meta-mirror layer and a light-emitting region, according to an example embodiment.

FIG. 3 is a view illustrating a structure in which a laser apparatus 200 according to an example embodiment further includes a conductive graphene layer formed between a meta-mirror layer and a light-emitting region.

Referring to FIG. 3, the laser apparatus 200 according to the present example embodiment may include a meta-mirror layer 12, a laser emitter 14 formed above the meta-mirror layer 12, and an upper-mirror layer 16 formed on the laser emitter 14, and also include a conductive graphene layer 18 formed between the meta-mirror layer 12 and the laser emitter 14. The conductive graphene layer 18 may have a very small thickness and be optically transparent, and may be formed on the meta-mirror layer 12 to thereby prevent non-uniform current flow.

Figure 4A:
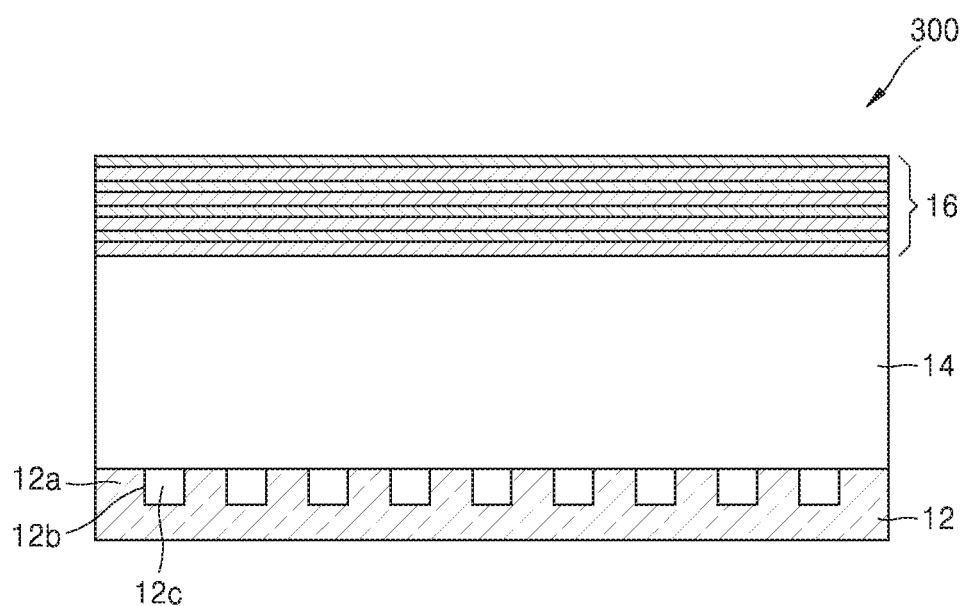
FIG. 4A is a cross-sectional view illustrating a laser apparatus in which a transparent conductive oxide is formed in a groove of a meta-mirror layer, according to an example embodiment.

FIG. 4A is a view illustrating a structure in which a transparent conductive oxide (TCO) is formed in a groove of a meta-mirror layer in a laser apparatus 300 according to an example embodiment.

Referring to FIG. 4A, the laser apparatus 300 according to the present example embodiment may include a meta-mirror layer 12 having an upper surface in which a plurality of patterns 12a and 12b are formed, a laser emitter 14 formed on the meta-mirror layer 12, and an upper-mirror layer 16 formed on the laser emitter 14. The patterns 12a and 12b formed in the surface of the meta-mirror layer 12 may include protrusions 12a each having a rectangular shape, and regions between the protrusions 12a of the meta-mirror layer 12 may be grooves 12b. The grooves 12b may be regions filled with a TCO. The TCO 12c may include at least one unrestrictedly selected from Indium-Tin-Oxide (ITO), Indium-Zinc-Oxide (IZO), Ga—In—Zn-Oxide (GIZO), Al—Zn-Oxide (AZO), Ga—Zn-Oxide (GZO), and ZnO.

As the grooves 12b of the meta-mirror layer 12 are filled with a transparent material such as a TCO 12c, the grooves 12b are optically transparent and uniform current flow may be obtained.

The TCO 12c may be replaced with another transparent material, for example, transparent inorganic dielectric or transparent organic dielectric. The transparent inorganic dielectric may include $SiO_2$ or $ZrO_2$. The transparent organic dielectric may include PMMA or PS.

Figure 4B:
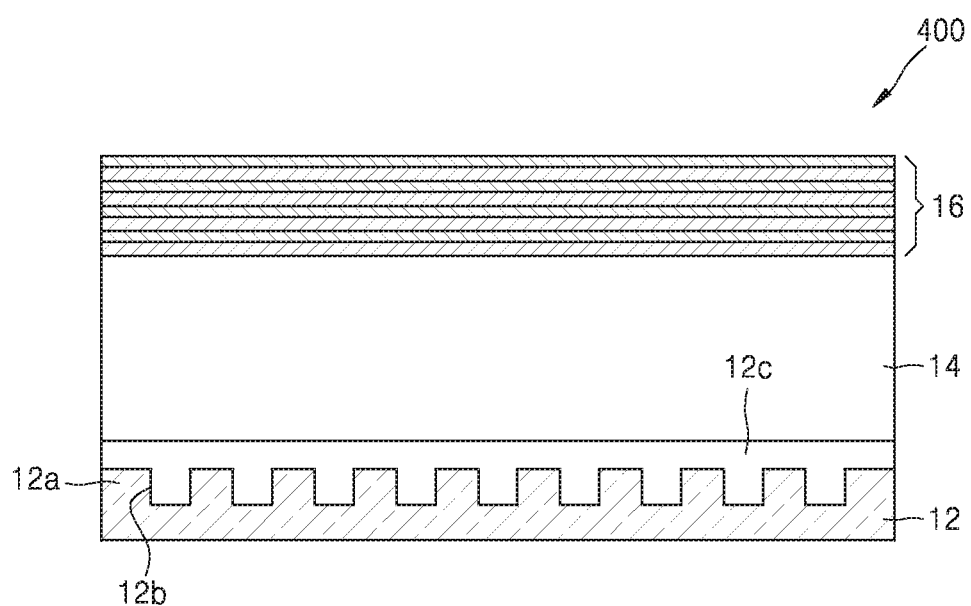
FIG. 4B is a cross-sectional view illustrating a laser apparatus in which a transparent conductive oxide is formed in a groove of a meta-mirror layer and extended on protrusions, according to an example embodiment.

As shown in FIG. 4B which illustrates a laser apparatus 400 according to another example embodiment, the groove 12b may be completely filled with the TCO 12c and the protrusions 12a may also be covered with the TCO 12c. That is, the TCO 12c may fill the groove 12b and be extended on the protrusions 12a. As a result, the upper surface of the meta-mirror layer 12 may be completely covered with the TCO 12c. An upper surface of the TCO 12c filling the groove 12b and covering the protrusions 12a may be flattened. Accordingly, the TCO 12c may also be used as a flattening layer. The laser emitter 14 may be formed on the flattened surface of the TCO 12c.

Figure 5:
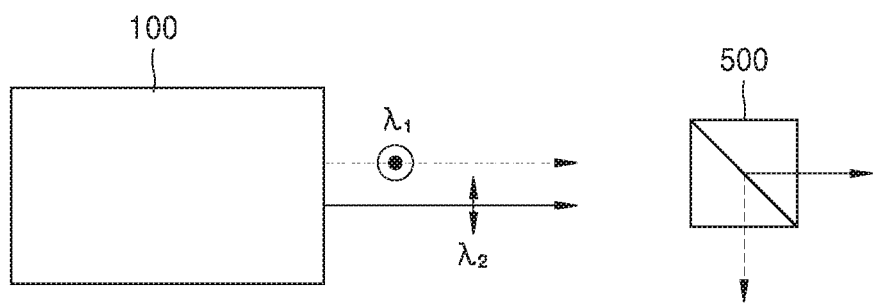
FIG. 5 is a view illustrating an example of separating, by wavelength, a laser beam generated by a laser apparatus according to an example embodiment.

FIG. 5 is a view illustrating an example of separating, by wavelength, a laser beam generated by a laser apparatus 100 according to an example embodiment.

Referring to FIG. 5, the laser apparatus 100 according to the present example embodiment may generate light having vertical polarization and including at least two or more wavelengths through two separate resonance modes. Multi-wavelength light generated by the laser apparatus 100, that is, light having a wavelength of $\lambda 1$ and light having a wavelength of $\lambda 2$, may be separated by a PBS 500 to have different optical paths.

Figure 6:
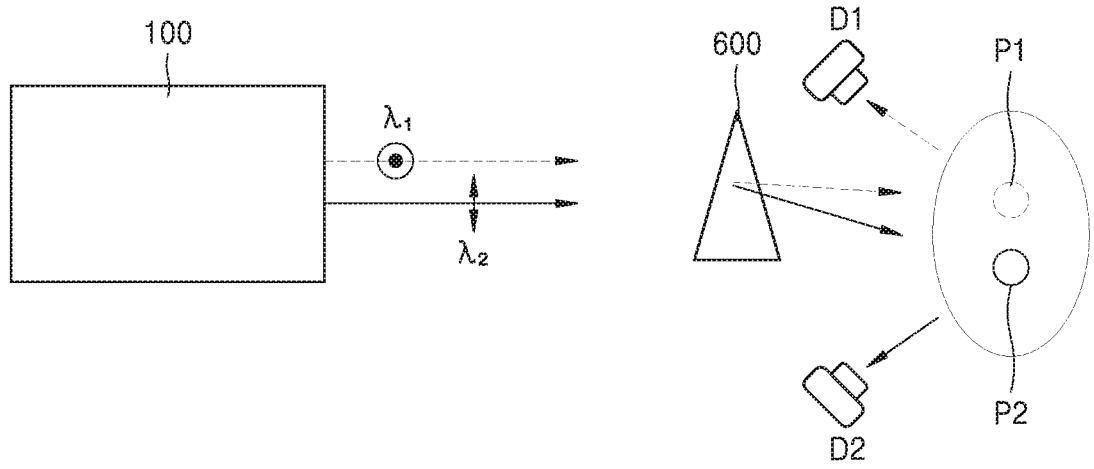
FIG. 6 is a view illustrating an example of measuring positions of adjacent individual objects by using a laser beam generated by a laser apparatus according to an example embodiment.

FIG. 6 is a view illustrating an example of measuring positions of adjacent individual objects by using a laser beam generated by a laser apparatus 100 according to an example embodiment.

Referring to FIG. 6, an optical path of multi-wavelength light generated by the laser apparatus 100, that is, light having a wavelength of $\lambda 1$ and light having a wavelength of $\lambda 2$, may be partially changed by a prism 600 so as to be radiated to a first object P1 and a second object P2, respectively. Light reflected from the first object P1 and light reflected from the second object P2 may be detected by a first detector D1 and a second detector D2, respectively, after passing through a polarizer. By using the laser apparatus 100, it is possible to simultaneously measure optical characteristics of the first object P1 and the second object P2 at adjacent positions, thereby reducing measurement time and improving the accuracy of measurement.

Figure 7:
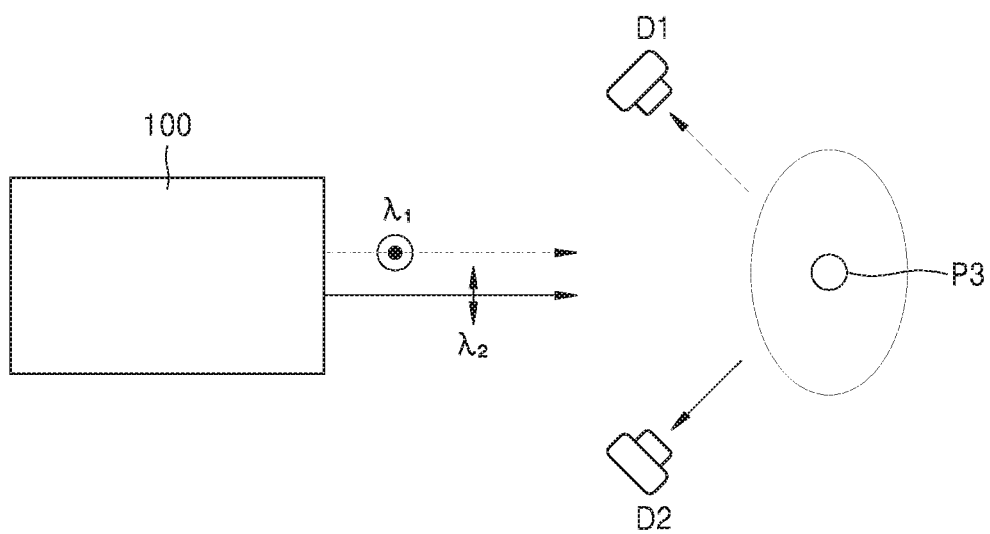
FIG. 7 is a view illustrating an example of measuring characteristics of an object by using a laser beam generated by a laser apparatus according to an example embodiment.

FIG. 7 is a view illustrating an example of measuring characteristics of an object by using a laser beam generated by a laser apparatus 100 according to an example embodiment.

Referring to FIG. 7, multi-wavelength light generated by the laser apparatus 100, that is, light having a wavelength of $\lambda 1$ and light having a wavelength of $\lambda 2$ may be incident on an object P3. The multi-wavelength light incident on the object P3 may be detected by a first detector D1 and a second detector D2, respectively, after passing through a polarizer. Since the multi-wavelength light generated by the laser apparatus 100, that is, the light having the wavelength of $\lambda 1$ and the light having the wavelength of $\lambda 2$, are incident on the same object P3, optical information at different wavelengths to the object P3 may be simultaneously measured. Information about the object P3 may be measured by analyzing optical information detected by the first detector D1 and optical information detected by the second detector D2. When analyzing the composition and content of an object by using an optical spectroscopic analysis technique, optical characteristics such as absorption or reflection according to wavelengths are measured, and in this case, the content of a known composition may be easily measured using light having different wavelengths.

As described above, according to the example embodiments, a vertical polarization multi-wavelength laser apparatus may be provided by forming a pattern layer having a metasurface structure in a mirror layer.

It should be understood that embodiments described herein should be considered in a descriptive sense only and not for purposes of limitation. Descriptions of features or aspects within each example embodiment should typically be considered as available for other similar features or aspects in other example embodiments.

While one or more example embodiments have been described with reference to the figures, it will be understood by those of ordinary skill in the art that various changes in form and details may be made therein without departing from the spirit and scope as defined by the following claims.

What is claimed is:

1. A multi-wavelength laser apparatus comprising:
    a meta-mirror layer having a surface in which a plurality of patterns are formed;
    a laser emitter disposed on the meta-mirror layer, the laser emitter comprising a layer of light emitting material; and
    an upper-mirror layer disposed on the laser emitter,
    wherein the plurality of patterns are spaced apart from a bottom surface of the meta-mirror layer, the meta-mirror layer has the same material in the entire region of the meta-mirror layer and the meta-mirror, the laser emitter and the upper-mirror layer are sequentially stacked in the described order,
    wherein the layer of light emitting material of the laser emitter is directly disposed on the meta-mirror layer and the upper mirror layer is directly disposed on the laser emitter.

2. The multi-wavelength laser apparatus of claim 1, wherein the plurality of patterns formed in the surface of the meta-mirror layer comprise:
   protrusions protruding toward the laser emitter; and
   a groove region interposed between the protrusions.

3. The multi-wavelength laser apparatus of claim 2, wherein the groove region is an empty space.

4. The multi-wavelength laser apparatus of claim 2, wherein the groove region is filled with transparent material.

5. The multi-wavelength laser apparatus of claim 2, wherein each of the protrusions has a rectangular cross-section.

6. The multi-wavelength laser apparatus of claim 2, wherein a formation period of the plurality of patterns is several hundred nanometers or less.

7. The multi-wavelength laser apparatus of claim 2, wherein the meta-mirror layer comprises Ag, Au, Al, Cu, Pt, Mn, Zr, Zn, or an alloy.

8. The multi-wavelength laser apparatus of claim 1, wherein the laser emitter is configured to generate at least one of visible light, near-infrared light, mid-infrared light, and far-infrared light.

9. The multi-wavelength laser apparatus of claim 1, wherein the laser emitter comprises at least one of:
   a Group III-V semiconductor material layer,
   a mixture layer comprising quantum dots of at least one of a Group III-V material and a Group II-VI material, and
   an organic dye mixture layer.

10. The multi-wavelength laser apparatus of claim 1, wherein the upper-mirror layer comprises at least one of a metal material, an alloy, and a distributed Bragg reflector (DBR) structure.

11. The multi-wavelength laser apparatus of claim 4, wherein the transparent material is transparent conductive oxide, transparent inorganic dielectric or transparent organic dielectric.

12. The multi-wavelength laser apparatus of claim 4, wherein the transparent material is a flattening layer and extended on the protrusions.

13. A multi-wavelength laser apparatus comprising:
   a meta-mirror layer having a surface in which a plurality of patterns are formed;
   a laser emitter disposed on the meta-mirror layer, the laser emitter comprising a layer of light emitting material;
   a conductive graphene layer interposed between the meta-mirror layer and the laser emitter; and
   an upper-mirror layer disposed on the laser emitter,
   wherein the plurality of patterns are spaced apart from a bottom surface of the meta-mirror layer, the meta-mirror layer has the same material in the entire region of the meta-mirror layer and the meta-mirror, the laser emitter and the upper-mirror layer are sequentially stacked in the described order,
   wherein the layer of light emitting material of the laser emitter is directly disposed on the conductive graphene layer and the upper mirror layer is directly disposed on the laser emitter.

* * * * *